A method of fabricating a multilayer ceramic substrate includes stacking one or a plurality of unfired ceramic greensheets on one or both sides of a previously fired ceramic substrate, thereby forming a stack, each unfired ceramic greensheet having a firing temperature substantially equal to or lower than a firing temperature of the previously fired ceramic substrate, stacking a restricting greensheet on the unfired ceramic greensheet composing an outermost layer of the stack, the restricting greensheet having a higher firing temperature than each unfired ceramic greensheet, firing the stack at the firing temperature of the unfired ceramic green sheets with or without pressure applied via the restricting greensheet while the stack is under restriction by the restricting greensheet, thereby integrating the stack, and eliminating remainders of the restricting greensheet after the firing step.

11 Claims, 5 Drawing Sheets

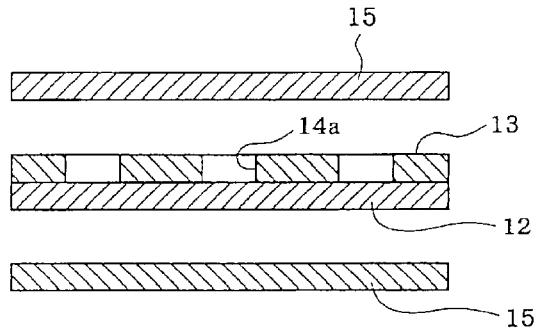

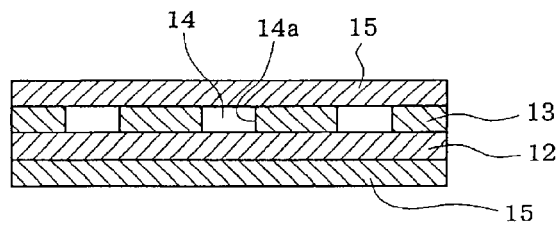

METHOD OF FABRICATING MULTILAYER CERAMIC SUBSTRATE

BACKGROUND OF THE INVENTION

1. Field of the Invention

This invention relates to a method of fabricating a multilayer ceramic substrate by stacking unfired ceramic greensheets on either one or both of sides of a previously fired ceramic substrate.

2. Description of the Related Art

Multilayer ceramic substrates have conventionally been fabricated by stacking greensheets. In the greensheet stacking process, after via holes have been formed in a plurality of ceramic greensheets, the via holes of each sheet are filled with conductor paste so that via conductors are formed, and a wiring pattern is printed on each ceramic greensheet using conductor paste. Thereafter, these ceramic greensheets are made by the greensheet stacking process and thermo-compression bonding into a raw substrate. Subsequently, the raw substrate is fired to be fabricated into a multilayer ceramic substrate.

However, about 15 to 30% firing shrinkage occurs in a process of firing the raw substrate. This renders control of dimensional accuracy in the substrate difficult. Moreover, since a shrinkage stress of both sides of the substrate become non-uniform in a multilayer ceramic substrate which has irregularity such as cavity, warp tends to occur in the fired substrate. In particular, warp becomes larger in a bottom of the cavity.

Further, firing temperatures of both types of ceramic greensheets need to be equalized when a composite multilayer ceramic substrate is fabricated by stacking insulating ceramic greensheets and other ceramic greensheets made from material differing in a dielectric substance and magnetic substance. Furthermore, since delamination needs to be prevented by reducing difference in the behavior in the firing shrinkage, the freedom in material selection and accordingly the freedom in the design of the substrate are very limited.

A firing process has recently been proposed reducing the firing shrinkage of the substrate thereby improving the dimensional accuracy of the substrate, as shown in JP-A-2001-267743. In this firing process, an unfired ceramic greensheet on which a wiring pattern is previously printed is stacked on a previously fired alumina substrate to be further processed by thermo-compression bonding. A stack of the greensheet and the substrate is then fired to be fabricated into a multilayer ceramic substrate. In this method, the firing shrinkage of each ceramic greensheet is restrained by the previously fired alumina substrate, whereby the firing shrinkage of the entire substrate is reduced.

However, the results of an experiment conducted by the inventor reveals that a shrinking force of the greensheet is so large that the firing shrinkage thereof cannot sufficiently be restrained even when only the previously fired alumina substrate is applied to one side of the ceramic greensheet. As a result, peeling occurs between a fired layer of ceramic greensheet and previously fired alumina substrate, a crack occurs on the fired layer of ceramic greensheet, and warp occurs in the substrate, whereupon a yield of the products is reduced.

Further, as a firing process reducing the firing shrinkage of the substrate thereby to improve the dimensional accuracy thereof, processes for firing under pressure have been developed as shown in WO91/10630 and JP-A-9-92983. In these firing processes, a restricting alumina greensheet which is not fired at a firing temperature (800 to 1000° C.) of a low-temperature firable ceramic is stacked on both sides of a low-temperature firable ceramic substrate (raw substrate) before the low-temperature firable ceramic is fired. In this state, the raw substrate is fired at a temperature ranging from 800 to 1000° C. under pressure. Subsequently, remainders of the restricting alumina greensheets are eliminated from the sides of the fired substrate by a blasting process etc., whereby a low-temperature firable ceramic substrate is fabricated.

However, when a low-temperature firable ceramic substrate with a cavity is fired by the above-mentioned firing under pressure, pressure applied via the restricting alumina greensheet to a cavity area acts concentrically on a peripheral edge of the cavity, and no pressure is applied to a bottom of the cavity. As a result, the cavity bottom is warped into a convexity and accordingly, the dimensional accuracy of the cavity cannot be ensured.

SUMMARY OF THE INVENTION

Therefore, a primary object of the present invention is to provide a method of fabricating multilayer ceramic substrate which can improve, to a large extent, the freedom in the selection of material with respect to a firing temperature, firing shrinkage characteristic, etc. of a ceramic material forming each layer of the multilayer ceramic substrate, and which can fabricate a multilayer ceramic substrate with a high dimensional accuracy without delamination and warp, which substrate is difficult to fabricate in the conventional fabricating methods.

Another object of the invention is to provide a method of fabricating a multilayer ceramic substrate which can prevent the cavity bottom from being warped into the convexity and which can fabricate a multilayer ceramic substrate with a high dimensional accuracy.

To achieve the primary object, the present invention provides a method of fabricating a multilayer ceramic substrate comprising stacking one or a plurality of unfired ceramic greensheets on one or both sides of a previously fired ceramic substrate, thereby forming a stack, each unfired ceramic greensheet having a firing temperature substantially equal to or lower than a firing temperature of the previously fired ceramic substrate, stacking a restricting greensheet on the unfired ceramic greensheet composing an outermost layer of the stack, the restricting greensheet having a higher firing temperature than each unfired ceramic greensheet, firing the stack at the firing temperature of the unfired ceramic green sheets with or without pressure applied via the restricting greensheet while the stack is under restriction by the restricting greensheet, thereby integrating the stack, and eliminating remainders of the restricting greensheet after the firing step.

The present invention is characterized in that the unfired ceramic greensheets are stacked on the previously fired substrate so that the stack is formed and that the restricting greensheet is stacked on the stack and the stack is fired with or without pressure being applied while being under restriction by the restricting greensheet. Consequently, firing shrinkage, warp or other deformation of the unfired ceramic greensheet in the X and Y directions is restrained substantially uniformly at both sides thereof by the restricting greensheet and the previously fired substrate respectively during the firing step. As a result, a multilayer ceramic substrate with a good dimensional accuracy and no delamination nor warp can be fabricated. Further, this method is free from differences in the firing temperature, firing shrinkage characteristic, etc. between the previously fired substrate and the unfired ceramic greensheet. Consequently, the degree of freedom can be improved in the selection of material in view of a firing temperature, firing shrinkage characteristic, etc. of a ceramic material composing each layer of the multilayer ceramic substrate. Accordingly, a multilayer ceramic substrate with good dimensional accuracy but without delamination or warp can be fabricated although it has been difficult to fabricate such a multilayer ceramic substrate in the conventional fabricating method.

In the step of stacking the unfired ceramic greensheet on the previously fired substrate, the unfired ceramic greensheet may merely be laid on the previously fired substrate. The reason for this is that the ceramic greensheets and previously fired substrate can be bonded together under heat and pressure when the stack is heated under pressure at a subsequent step. Generally, however, it is preferable that the previously fired substrate and the unfired ceramic greensheets are temporarily tacked together, for example, by means of thermo-compression bonding or adhesive agent, in the step where the unfired ceramic greensheet is stacked on the previously fired substrate. As a result, since misregistration is prevented between the previously fired substrate and the unfired ceramic greensheet, the stack can be treated easily at a subsequent step. Further, since a bond strength is improved between the ceramic greensheet and the previously fired substrate, they can be prevented from delamination and warp.

Further, the restricting greensheet may merely be laid on the unfired ceramic greensheet at a step where the restricting greensheet is stacked on the unfired ceramic greensheet composing the outermost layer of the stack. The reason for this is that the restricting greensheet and the outermost unfired ceramic greensheet can be bonded together under heat and pressure when heated under pressure at a subsequent step. Generally, however, it is preferable that the restricting greensheet and the unfired ceramic greensheet are temporarily tacked together in the step where the restricting greensheet is stacked on the unfired ceramic greensheets. In this case, a restricting force of the restricting greensheet can be applied to the unfired ceramic greensheet and accordingly, a multilayer ceramic substrate with good dimensional accuracy but without delamination or warp can be fabricated although it has been difficult to fabricate such a multilayer ceramic substrate in the conventional fabricating methods.

When the previously fired substrate and the unfired ceramic greensheet are made from a same ceramic material, the multilayer ceramic substrate with a single ceramic composition can be fabricated in which electrical characteristics such as an insulating characteristic are substantially uniform over the all layers. Alternatively, the previously fired substrate and the unfired ceramic greensheet may be made from different ceramic materials from each other, and the ceramic materials may be selected so that the firing temperature of the unfired ceramic greensheet is equal to or lower than a firing temperature of the previously fired substrate. Consequently, a composite multilayer ceramic substrate containing various functional materials can be fabricated although it has been difficult to fabricate such a multilayer ceramic substrate in the conventional fabricating methods.

The unfired ceramic greensheet is preferably made from a low-temperature fired ceramic material which is fired at a temperature equal to or lower than 1000° C. Consequently, ceramics which is less expensive and has a high mechanical strength, for example, alumina greensheets, can be used as the restricting greensheet, and materials with respective low melting points, for example, Ag, Au and Cu systems, can be used as a wiring conductor to be printed on the unfired ceramic greensheets. Each of these materials has good electrical characteristics such as a low resistance value.

The previously fired substrate and/or the unfired ceramic greensheet are preferably made from a ceramic having any one of insulating, dielectric, magnetic, piezoelectric and resistive functions. In this case, the insulating ceramic refers to a ceramic used to form an insulating layer of the substrate. For example, the insulating ceramic includes low-temperature firable ceramics, high-temperature firable ceramics such as alumina. Since the previously fired substrate is fired independently, every type of ceramic can be used. Accordingly, the unfired ceramic greensheet can be formed from a ceramic material fired at a temperature equal to or lower than a firing temperature of the previously fired substrate.

To achieve the second object, the present invention provides a method of fabricating a multilayer ceramic substrate having a cavity, wherein the previously fired substrate is placed on a bottom of a portion where the cavity is to be formed, and an opening for forming the cavity is formed in the unfired ceramic greensheet which is stacked on the previously fired substrate, before or after the stacking. When formed in the unfired ceramic greensheet before the stacking, the opening for forming the cavity is formed by punching etc. simultaneously with the forming of via holes. Further, when formed in the unfired ceramic greensheet after the stacking, a ceramic green sheet containing a photosensitive resin is formed, and the opening for forming the cavity is formed on the ceramic greensheet by a technique for forming a desirable opening by photo-etching.

When the previously fired substrate is placed on the bottom of the cavity and the multilayer ceramic substrate with the cavity is fired while being restricted, the cavity bottom can be prevented from being warped into the convex shape and a dimensional accuracy of the cavity can be ensured.

Further, the following describes a case where a multilayer ceramic substrate having a stepped cavity is fabricated. That is, every time a predetermined number of the unfired ceramic greensheets corresponding to a number of layers of one step of the stepped cavity is stacked on the previously fired substrate, the restricting greensheet are stacked on the unfired ceramic greensheet into the stack, and the stack is fired while being under restriction by the restricting ceramic greensheet, thereby fabricating a new fired substrate with one step of cavity. Thereafter, another predetermined number of the unfired ceramic greensheets corresponding to a number of layers of a subsequent step of the stepped cavity and the restricting greensheet are stacked on said new fired substrate into a stack, and the stack is fired while being under restriction by the restricting greensheet, after remainders of the restricting greensheet for fabrication of said new fired substrate has been eliminated, repeatedly so that the multilayer ceramic substrate having the stepped cavity is fabricated. Consequently, each stepped portion of the cavity has a good flatness and a good dimensional accuracy. In this case, too, the opening for forming the cavity may be formed in the unfired ceramic greensheet which is stacked on the previously fired substrate, before or after the stacking.

The conductor pattern may be printed on the unfired ceramic greensheet after the stacking. However, a conductor pattern co-firable with the unfired ceramic greensheet may be printed on said unfired ceramic greensheet and thereafter, said unfired ceramic greensheet may be stacked on one or both sides of the previously fired ceramic substrate. Consequently, the printing and stacking can efficiently be carried out when a plurality of the unfired ceramic green sheets are staked on the previously fired substrate.

The multilayer ceramic substrate preferably has a surface and a back each one of which is dissimilar to the other. Even if the multilayer ceramic substrate has such a complicated structure as to cause a warp or other deformation, warp or other deformation can be prevented and the dimensional accuracy thereof can be improved.

Further, a thick film resistor is preferably formed on the fired substrate and the thick film resistor is preferably trimmed for adjustment of a resistance value, and thereafter the unfired ceramic greensheet is preferably stacked on the fired substrate. Consequently, a multilayer ceramic substrate with an integrated thick film resistor whose resistance value is adjusted by trimming can be fabricated with good dimensional accuracy.

The multilayer ceramic substrate fabricated in the above-described method of the present invention can be used as those with various purposes. For example, the multilayer ceramic substrate may be used to manufacture module semiconductor devices such as communication module products, or vehicle module products.

BRIEF DESCRIPTION OF THE DRAWINGS

Other objects, features and advantages of the present invention will become clear upon reviewing of the following description of the embodiments, made with reference to the accompanying drawings, in which.

DETAILED DESCRIPTION OF THE INVENTION

Figure 1A:
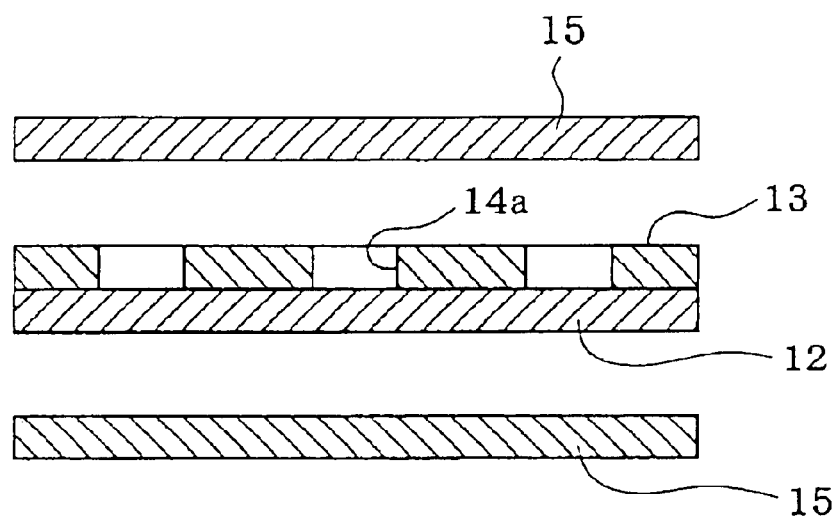
FIGS. 1A, 1B and 1C are views explaining the processing in the method of fabricating a multilayer ceramic substrate having one side formed with a cavity in accordance with a first embodiment of the invention.
Figure 1B:
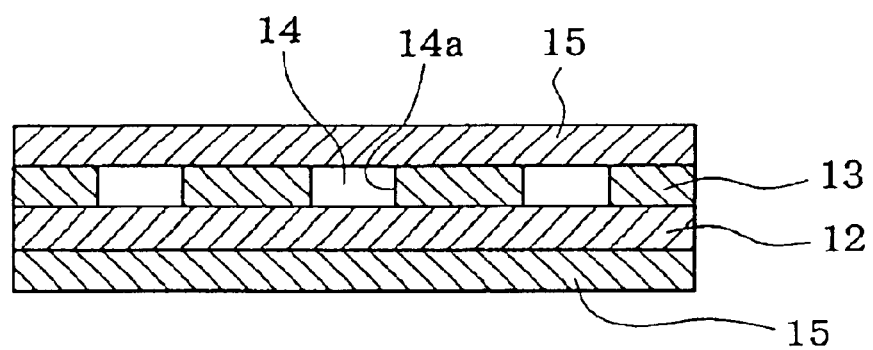
Figure 1C:
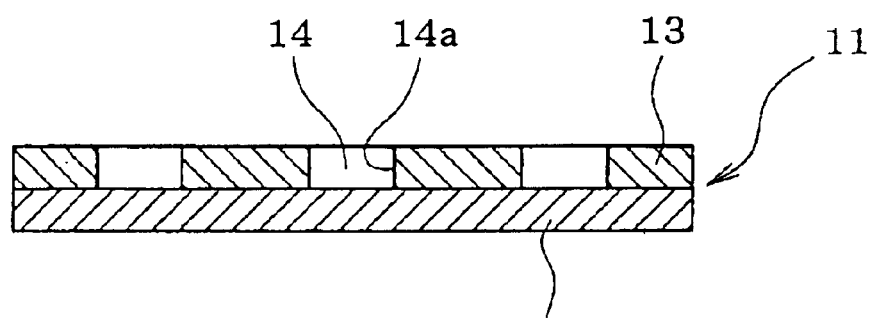
Figure 2:
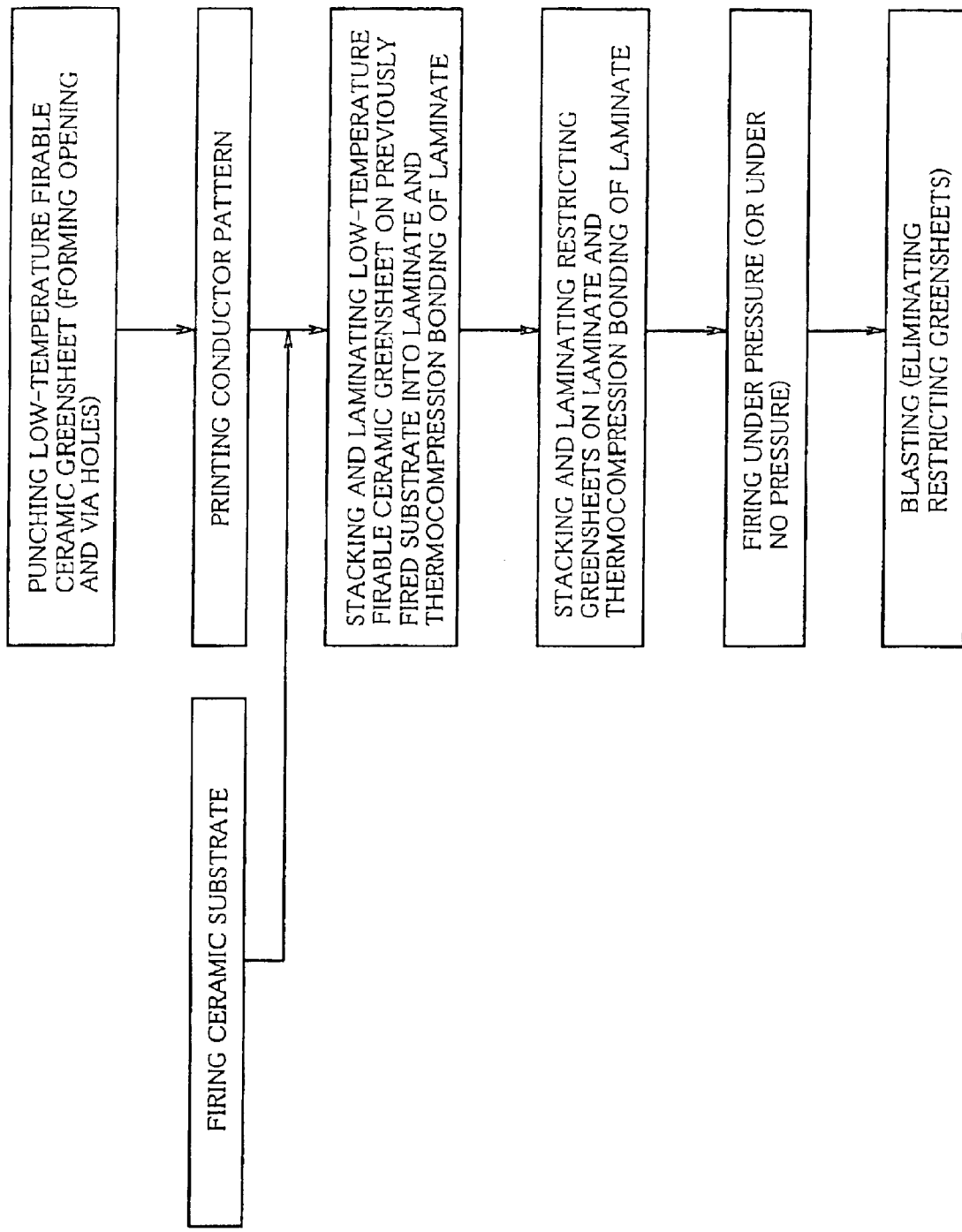
FIG. 2 is a flowchart explaining fabricating steps in the method of the first embodiment.
Figure 3:
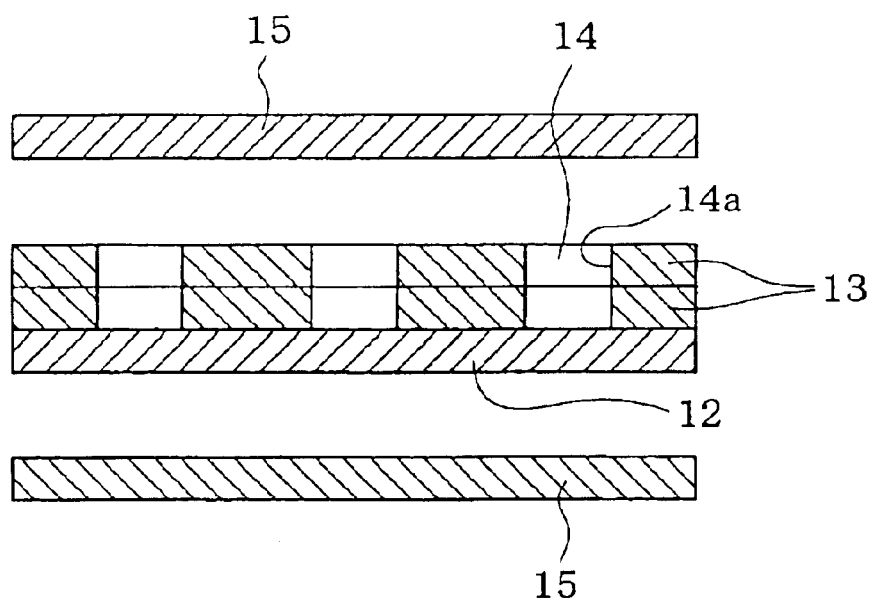
FIG. 3 is a view explaining the processing in the method of fabricating a multilayer ceramic substrate having one side formed with a cavity whose depth corresponds to two layers.

A first embodiment in which the invention is applied to a method of fabricating a multilayer ceramic substrate having one side formed with a cavity will be described with reference to FIGS. 1A to 3. A multilayer ceramic substrate 11 having one side formed with a cavity is fabricated in the embodiment. In the substrate 11, one or a plurality of unfired low-temperature firable ceramic greensheets 13 are stacked and laminated on a previously fired substrate 12, so that a stack is formed, as shown in FIGS. 1C and 3. Two restricting greensheets 15 are further stacked on both sides of the laminate respectively. The stack is then fired at a temperature ranging from 800 to 1000° C. while being under restriction by the restricting greensheets 15 (with or without pressure applied). The previously fired substrate 12 forms a bottom of the cavity 14.

The multilayer ceramic substrate 11 is fabricated through the following steps. Firstly, the previously fired substrate 12 is prepared. The substrate 12 is formed by firing a ceramic substrate and may be a monolayer or multilayer. A ceramic material formed into the substrate 12 may be an insulating ceramic, dielectric ceramic, magnetic ceramic, piezoelectric ceramic or a ceramic with a resistor. What is essential is that a ceramic material should be fired at a temperature equal to or higher than a firing temperature of the low-temperature firable ceramic greensheet 13. Further, when the previously fired substrate 12 is a multilayer substrate, each layer may be formed from the same ceramic. The layers may include those formed from different ceramics which are co-firable.

The insulating ceramic is used for forming an insulating layer of the substrate and includes a low-temperature firable ceramic or a high-temperature firable ceramic such as alumina. A low-temperature firable ceramic, when formed into the previously fired substrate 12, may be of the same type as the low-temperature firable ceramic greensheet 13. Moreover, another type of low-temperature firable ceramic fired at a temperature equal to higher than a firing temperature of the low-temperature firable ceramic greensheet 13. Further, a thick-film conductor or thick-film resistor of the $RuO_2$ system etc. may be formed on a surface of the previously fired substrate 12 by simultaneous firing or subsequent processing. When a thick-film resistor is formed on the surface of the previously fired substrate 12, the thick-film resistor may be trimmed for adjustment of a resistance value thereof before the low-temperature firable ceramic greensheet 13 is stacked on the previously fired substrate 12.

Next, the low-temperature firable ceramic greensheet 13 is prepared. A low-temperature firable ceramic material for the greensheet 13 may be a blend of 50 to 65 weight % (preferably 60 weight %) of glass of $CaO—SiO_2—Al_2O_3—B_2O_3$ system and 50 to 35 weight % (preferably 40 weight %) of alumina, for example. Other low-temperature firable ceramic materials include a blend of glass of $MgO—SiO_2—Al_2O_3—B_2O_3$ system and alumina, a blend of glass of $PbO—SiO_2—B_2O_3$ system and alumina, or a low-temperature firable ceramic material which can be fired at a temperature ranging from 800 to 1000° C., for example, a crystallized glass of cordierite system.

In making the low-temperature firable ceramic greensheet 13, a binder (for example, polyvinyl butyral, acrylic resin, etc.), a solvent (for example, toluene, xylene, butanol, etc.) and a plasticizer are blended with the aforementioned low-temperature firable ceramic material. These materials are sufficiently agitated and blended to be made into slurry. The slurry is further made into a tape of the low-temperature firable ceramic greensheet 13 by a doctor blade process. The tape of the low-temperature firable ceramic greensheet 13 is cut into a predetermined size and subsequently, an opening 14a to be formed into a cavity and via holes (not shown) are formed by punching at respective predetermined positions in each green sheet 13.

Thereafter, the process advances to a printing step where the via holes of the greensheet 13 are filled with a conductor paste of metal with a low melting point such as Ag, Ag/Pd, Au, Ag/Pt, Cu, etc. Further, when a plurality of low-temperature firable greensheets 13 are stacked on the previously fired substrate 12 as shown in FIG. 3, an inner layer conductor pattern (not shown) is printed on each low-temperature firable greensheet 13 stacked on an inner layer by the screen printing process using a conductor paste of metal with a low melting point such as Ag, Ag/Pd, Au, Ag/Pt, Cu, etc. A surface layer conductor pattern (not shown) is printed on the low-temperature firable greensheet 13 constituting a surface or uppermost layer by the screen printing process using the same type of the conductor paste of metal with a low melting point. The surface layer conductor pattern may be printed after a stack is fired under while being restricted. The above-described printing process is eliminated when a multilayer ceramic substrate to be fabricated has no via holes or inner layer conductor pattern.

Subsequently to the printing step, the process advances to a stacking step where one or a plurality of low-temperature firable greensheets 13 are stacked on the previously fired substrate 12. A resultant laminate is temporarily tacked by thermo-compression bonding. The conditions of the thermo-compression bonding preferably include an applied pressure ranging from $10^5$ to $10^7$ Pa and a heating temperature ranging from 60 to 150° C. The low-temperature firable greensheets 13 may merely be stacked on the previously fired substrate 12 in the stacking step and accordingly, the thermo-compression bonding may be eliminated.

Restricting greensheets 15 are then stacked on both sides of the stack respectively to be temporarily tacked by the thermo-compression bonding under the above-mentioned conditions. Even when the thermo-compression bonding has not been carried out in the stacking step, the low-temperature firable ceramic greensheets 13 and the previously fired substrate 12 can be bonded by the thermo-compression bonding in the process of thermo-compression bonding for the restricting green sheets 15. The thermo-compression bonding for the restricting greensheets 15 may be eliminated when firing is carried out under pressure.

When the low-temperature firable ceramic greensheet 13 is stacked only on one side of the previously fired substrate 12, the restricting greensheet 15 is stacked only on one side on which the greensheet 13 is stacked, and the restricting greensheet 15 to be stacked on the other side may be eliminated, as shown in FIGS. 1C and 3. The reason for this is that the previously fired substrate 12 serves to restrain the firing shrinkage of the greensheets 13 during the firing of the stack under restriction as each greensheet 15 does. In this case, a high-temperature firable ceramic such as alumina, zirconia, magnesia, etc. is used for the restricting greensheet 15. The high-temperature firable ceramic is not fired at the firing temperature of the low-temperature firable ceramic ranging from 800 to 1000° C. A binder (for example, resin of polyvinyl butyral, acrylic or nitrocellulose system, etc.), a solvent (for example, toluene, xylene, butanol, etc.) and a plasticizer are blended with a powder of the high-temperature firable ceramic. These materials are sufficiently agitated and blended to be made into slurry. The slurry is further made into a tape of the restricting greensheet 15 by the doctor blade process.

Subsequently, the stack on which the restricting greensheets 15 are stacked is interposed between two porous setter plates (not shown) made from alumina, SiC, etc. The stack is fired at a firing temperature of the low-temperature firable ceramic greensheet 13 ranging from 800 to 1000° C. while being under pressure of $10^5$ to $10^7$ Pa. Alternatively, the stack may be fired without being pressurized. In this case, the restricting greensheets 15 need to be bonded to the low-temperature firable ceramic greensheet 13 by the thermo-compression bonding during the stacking of the restricting greensheets 15. The restricting greensheet 15 (high-temperature firable ceramic such as alumina) is fired at a temperature ranging from 1300 to 1600° C. Accordingly, the restricting greensheet 15 remains unfired when fired at a temperature ranging from 800 to 1000° C. Organic substances such as the binder contained in the restricting greensheet 15 are thermally decomposed in the firing process to scatter away, thereby remaining as ceramic powder.

After the firing, the remainder (ceramic powder) of the restricting greensheet 15 adherent to both sides of the fired substrate 11 is eliminated by blasting or buffing, whereupon the multilayer ceramic substrate 11 with a cavity in one side thereof is completed.

According to the foregoing embodiment, the unfired low-temperature firable ceramic greensheet 13 is stacked on the previously fired substrate 12 so that the stack is fabricated. The restricting greensheets 15 are stacked on the stack, which is then fired under pressure or no pressure while being restricted by the restricting greensheets 15. Accordingly, firing shrinkage, warp or other deformation of the unfired low-temperature firable ceramic greensheet 13 is restrained substantially uniformly at both sides thereof by the restricting greensheets 15 and the previously fired substrate 12 during the firing step. Consequently, the multilayer ceramic substrate 11 without delamination or warp can be fabricated.

Moreover, when the multilayer ceramic substrate 11 with the cavity 14 is fabricated, the previously fired substrate 12 is located on the bottom of the cavity 14. When the stack is then fired while being restricted, the cavity bottom can be prevented from being warped into a convexity. Moreover, the dimensional accuracy of the cavity 14 can be ensured by the firing of the stack under restriction. Consequently, the multilayer ceramic substrate 11 with a high quality of cavity 14 can be fabricated. Accordingly, even when a bare semiconductor chip is mounted on the bottom of the cavity 14 in a flip-chip manner, bonding or connection between the bare chip and a conductive pad of the cavity bottom can accurately be carried out since the cavity bottom has no warp. Consequently, the reliability of the flip-chip mounting can be improved.

Further, the above-described fabricating method is free from differences in the firing temperature, firing shrinkage characteristic, etc. between the previously fired substrate 12 and the unfired ceramic greensheet 13. Consequently, a degree of freedom can be improved in the selection of material in view of a firing temperature, firing shrinkage characteristic, etc. of a ceramic material composing each layer of the multilayer ceramic substrate 11. Accordingly, a multilayer ceramic substrate 11 with good dimensional accuracy but without delamination or warp can be fabricated although it has been difficult to fabricate such a multilayer ceramic substrate in the conventional fabricating method.

The cavity opening 14a is formed in the low-temperature firable ceramic greensheet 13 by means of punching before the stacking and laminating in the foregoing embodiment. However, the cavity opening 14a may be formed in the greensheet 13 after the stacking using a photolithographic technique, instead.

Figure 4:
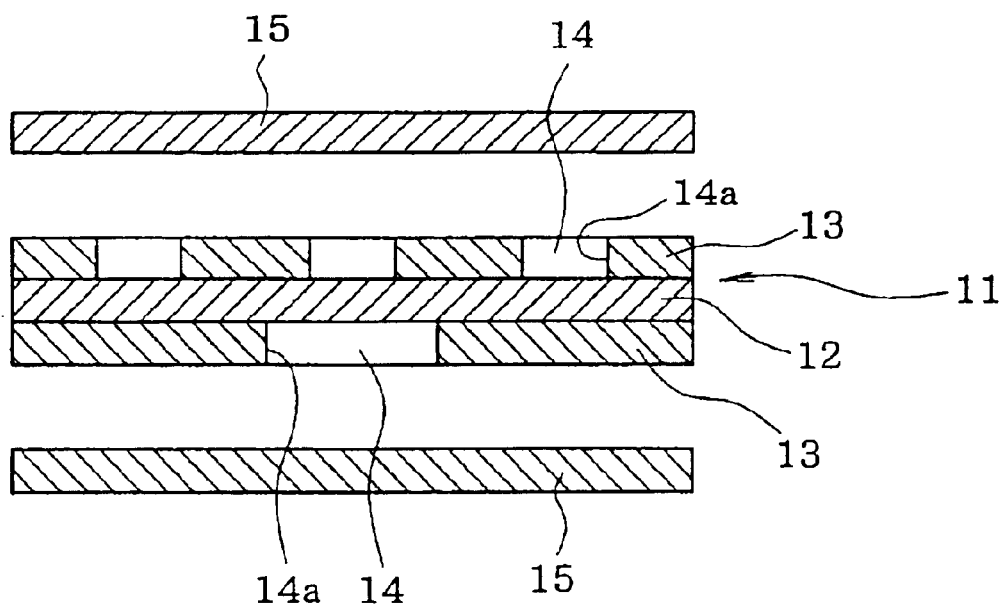
FIG. 4 is a view explaining the processing in the method of fabricating a multilayer ceramic substrate having both sides formed with respective cavities in accordance with a second embodiment of the invention.

FIG. 4 illustrates a second embodiment in accordance with the invention. The low-temperature firable ceramic greensheet 13 is stacked only on one side of the previously fired substrate 12 in the first embodiment. However, one or a plurality of low-temperature firable ceramic greensheets 13 are stacked on each of both sides of the previously fired substrate 12 as shown in FIG. 4. In this case, the unfired low-temperature firable ceramic greensheets 13 are stacked on both sides of the previously fired substrate 12 so that a stack is formed and thereafter, the restricting greensheets 15 are stacked on both sides of the stack respectively. The fabricating method of the second embodiment is the same as that of the foregoing embodiment in other respects.

Even when the multilayer ceramic substrate 11 with cavities formed in both sides thereof is fabricated as in the second embodiment, the previously fired substrate 12 is positioned on the bottom of the cavity 14 and the stack is then fired under restriction. Consequently, the cavity bottom can be prevented from being warped into a convexity, the multilayer ceramic substrate 11 with both cavities having good dimensional accuracy can be fabricated.

FIGS. 5A to 5D illustrate a third embodiment of the invention. The cavity 14 is formed in the multilayer ceramic substrate 11 in each of the first and second embodiments. The cavity 14 has a stepless simple configuration in each embodiment. In this case, no problem of deformation of the cavity 14 arises even when a plurality of unfired low-temperature firable ceramic greensheets 13 are simultaneously stacked on the previously fired substrate 12 to be bonded together by the thermo-compression bonding as shown in FIG. 3.

Figure 5A:
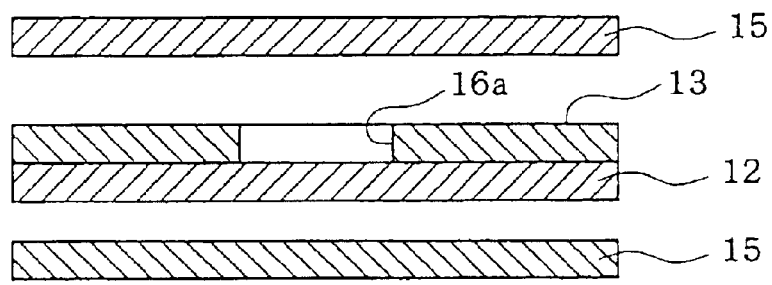
FIGS. 5A, 5B, 5C and 5D are views explaining the processing in the method of fabricating a multilayer ceramic substrate having a stepped cavity in accordance with a third embodiment of the invention.
Figure 5B:
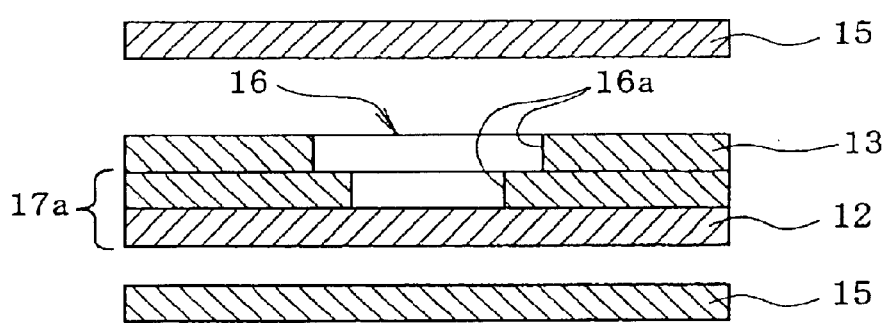
Figure 5C:
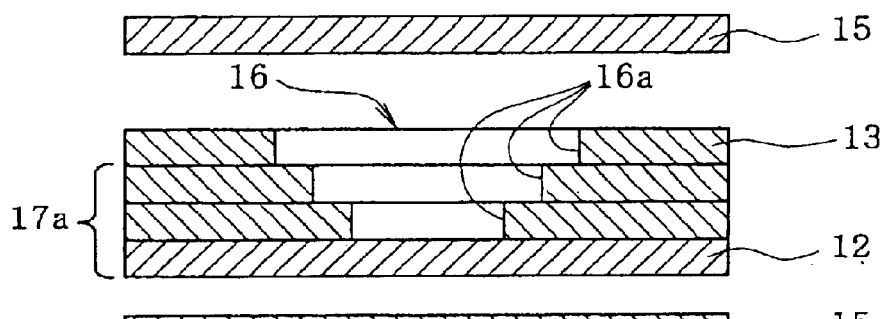
Figure 5D:
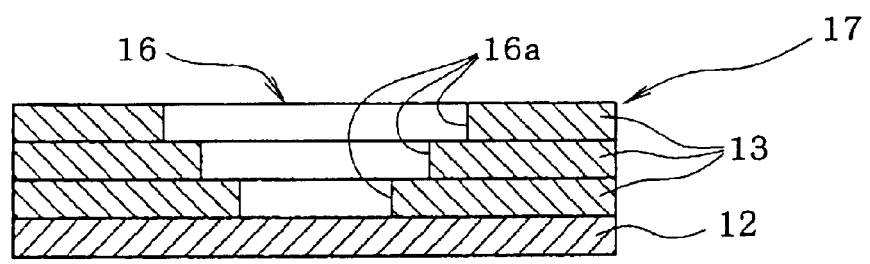

On the other hand, a plurality of low-temperature firable ceramic greensheets 13 having respective cavity-forming openings 16a with different sizes are used when a stepped cavity 16 is formed in a multilayer ceramic substrate. In this case, when the low-temperature firable ceramic greensheets 13 are simultaneously stacked to be bonded together by the thermo-compression bonding as shown in FIG. 5D, there is a possibility that a resultant pressure may deform the stepped portions of the stepped cavity 16. The third embodiment is directed to a solution of the above-described problem. When a multilayer ceramic substrate 17 having the stepped cavity 16 is fabricated, an unfired low-temperature firable ceramic greensheet 13 the number of which corresponds to that of layers forming one step of the cavity 16 is stacked on the previously fired substrate 12 as shown in FIG. 5A. Subsequently, the restricting greensheet 15 is stacked on the unfired low-temperature firable ceramic greensheet 13 to be fired under restriction, whereby a new previously fired substrate 17a having a cavity for one step is fabricated. The remainder of the restricting greensheet 15 is then eliminated by the blasting process and thereafter, a subsequent unfired low-temperature firable ceramic greensheet 13 the number of which corresponds to that of layers forming one step of the cavity 16 is stacked on the new substrate 17a to be fired under restriction, as shown in FIG. 5B. The above-described operation is repeated at the number of times corresponding to the number of remaining steps, so that the multilayer ceramic substrate 17 having the stepped cavity 16 is fabricated.

When the multilayer ceramic substrate 17 having the stepped cavity 16 is fabricated in the foregoing method, the configuration of each step can be prevented from deformation and a good dimensional accuracy can be achieved. In this case, too, the cavity-forming opening 16a may be formed in the unfired low-temperature ceramic greensheet 13 either before or after stacking.

Figure 6:
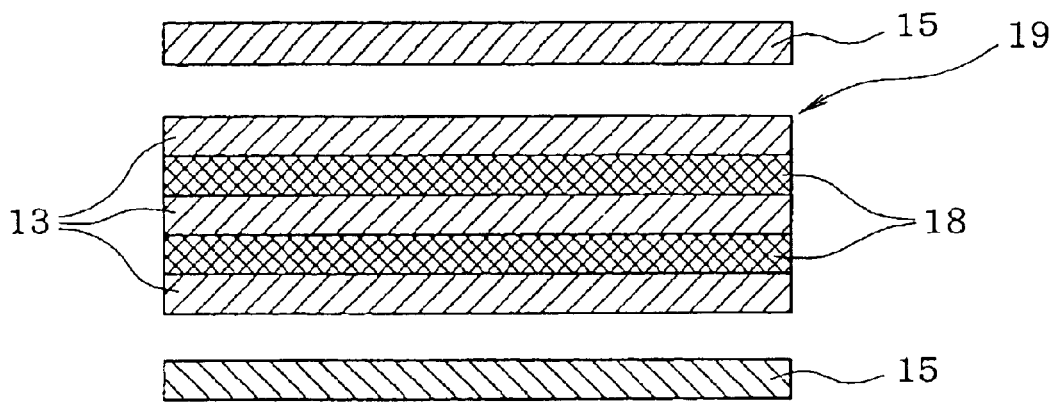
FIG. 6 is a view explaining the processing in the method of fabricating a composite multilayer ceramic substrate in accordance with a fourth embodiment of the invention.

FIG. 6 illustrates a fourth embodiment of the invention. In the fourth embodiment, a previously fired substrate 18 is made from a functional material other than the insulating ceramic, for example, dielectric ceramic, magnetic ceramic, piezoelectric ceramic or resistive ceramic. Although a plurality of previously fired substrates 18 are used in the fourth embodiment, a single substrate 18 may be used, instead. When a plurality of substrates 18 are used, one or a plurality of unfired ceramic greensheets 13 need to be interposed between each substrate 18 and the adjacent one. Further, the previously fired substrate 18 and the unfired ceramic greensheet 13 are stacked to be bonded by the thermo compression bonding, and subsequently, the restricting greensheets 15 are stacked on both sides of the stack to be fired under restriction, whereby a composite multilayer ceramic substrate 19 is fabricated.

The foregoing method is free from differences in the firing temperature, firing shrinkage characteristic, etc. between the previously fired substrate 18 and the unfired ceramic greensheet 13. Consequently, the degree of freedom can be improved in the selection of material in view of a firing temperature, firing shrinkage characteristic, etc. of a ceramic material composing each layer of the composite multilayer ceramic substrate 19. Accordingly, the composite multilayer ceramic substrate 19 with various integrated functional materials can be fabricated with good dimensional accuracy but without delamination or warp although it has been difficult to fabricate such a composite multilayer ceramic substrate in the conventional fabricating method.

Figure 7A:
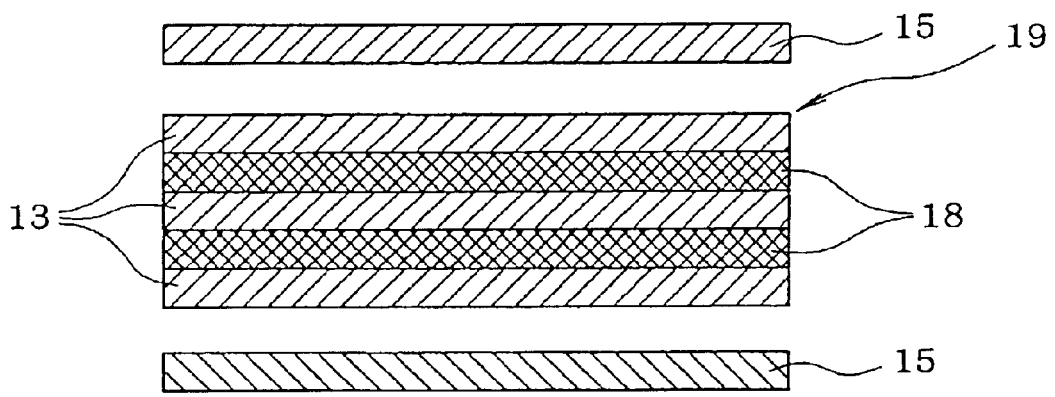
FIGS. 7A and 7B are views explaining the processing in the method of fabricating a composite multilayer ceramic substrate having both sides formed with respective cavities in accordance with a fifth embodiment of the invention.
Figure 7B:
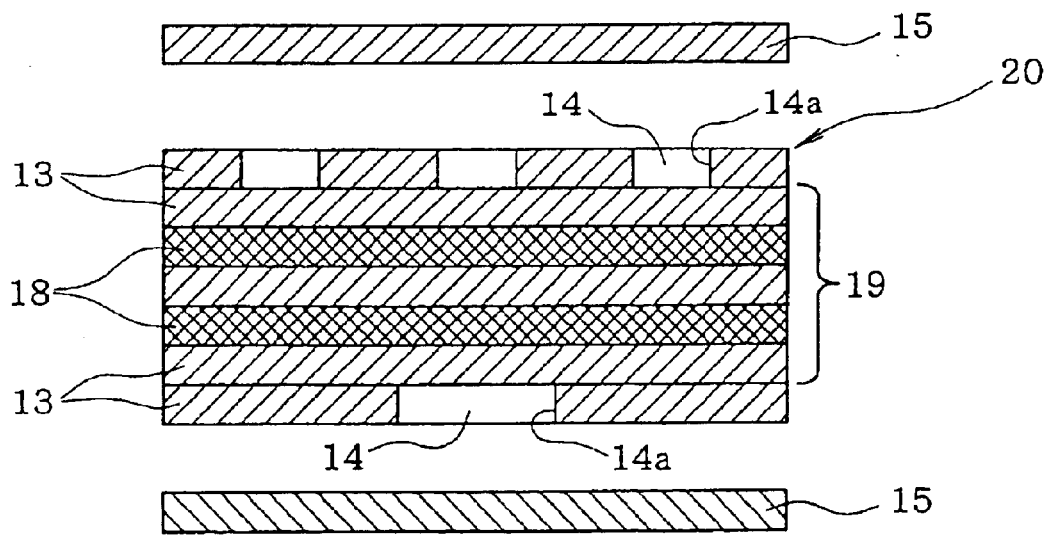

FIGS. 7A and 7B illustrate a fifth embodiment of the invention. The fifth embodiment is directed to a case where a composite multilayer ceramic substrate 20 with a cavity 14 is fabricated. In this case, the composite multilayer ceramic substrate fabricated in the same method as the method of the fourth embodiment is used as the previously fired substrate 19. One or a plurality of low-temperature firable ceramic greensheets 13 are stacked on both sides of the previously fired substrate 19. The cavity-forming opening 14a is formed in each low-temperature firable ceramic greensheet 13 before or after stacking. The low-temperature firable ceramic greensheets 13 are stacked on both sides of the previously fired substrate 19 respectively to be bonded together by the thermo-compression bonding. Subsequently, the restricting greensheets 15 are stacked on both sides of the stack to be fired under restriction, whereby the composite multilayer ceramic substrate 20 with the cavity 14 is fabricated.

The structure of the multilayer ceramic substrate to which the method of the present invention is applied should not be limited to those described in the foregoing embodiments. Changes can be made regarding the number of previously fired substrates, a location where a greensheet is stacked, the number of low-temperature firable ceramic greensheets, a configuration of the cavity and the type of ceramic material composing each layer of the previously fired substrate, etc.

The multilayer ceramic substrates fabricated in the respective methods of the foregoing embodiments can be used as multilayer circuit boards for various purposes. For example, semiconductor devices such as communication module products and vehicle module products may be produced using the multilayer ceramic substrate.

The inventor measured an amount of warp on the bottom of the cavity regarding the multilayer ceramic substrate fabricated under various conditions in the fabricating method of each embodiment. TABLES 1 and 2 show the results of measurement.

TABLE 1

Embodiments

| Sample No. | Previously fired substrate Material | Thickness after firing | Unfired ceramic greensheet Material | Thickness before firing | Restricting greensheet Material |
|---|---|---|---|---|---|
| 1 | (✕1) | 0.4 mm | (✕1) | 0.5 mm | Alumina |
| 2 | ↑ | 0.4 mm | ↑ | 0.5 mm | Zirconia |
| 3 | ↑ | 0.4 mm | ↑ | 0.5 mm | Magnesia |
| 4 | ↑ | 0.4 mm | ↑ | 0.2 mm | Alumina |
| 5 | ↑ | 0.4 mm | ↑ | 0.5 mm | Alumina |
| 6 | ↑ | 0.4 mm | ↑ | 0.7 mm | Alumina |
| 7 | ↑ | 0.2 mm | ↑ | 0.5 mm | Alumina |
| 8 | ↑ | 0.4 mm | ↑ | 0.5 mm | Alumina |
| 9 | ↑ | 0.6 mm | ↑ | 0.5 mm | Alumina |
| 10 | ↑ | 0.4 mm | ↑ | 0.5 mm | Alumina |
| 11 | ↑ | 0.4 mm | ↑ | 0.5 mm | Alumina |
| 12 | ↑ | 0.4 mm | ↑ | 0.5 mm | Alumina |
| 13 | ↑ | 0.4 mm | ↑ | 0.5 mm | Alumina |
| 14 | ↑ | 0.4 mm | ↑ | 0.5 mm | Alumina |

| Sample No. | Conditions for thermo compression bonding Temperature | Pressure | Pressure applied during firing | Cavity Structure | Amount of warp in bottom |
|---|---|---|---|---|---|
| 1 | 60° C. | $10^6$ Pa | $10^5$ Pa | one side | ≦5 μm |
| 2 | 60° C. | $10^6$ Pa | $10^6$ Pa | one side | ≦5 μm |
| 3 | 60° C. | $10^6$ Pa | $10^7$ Pa | one side | ≦5 μm |
| 4 | 60° C. | $10^6$ Pa | $10^5$ Pa | one side | ≦5 μm |
| 5 | 60° C. | $10^6$ Pa | $10^6$ Pa | one side | ≦5 μm |
| 6 | 60° C. | $10^6$ Pa | $10^7$ Pa | one side | ≦5 μm |
| 7 | 60° C. | $10^6$ Pa | $10^5$ Pa | one side | ≦5 μm |
| 8 | 60° C. | $10^6$ Pa | $10^6$ Pa | one side | ≦5 μm |
| 9 | 60° C. | $10^6$ Pa | $10^7$ Pa | one side | ≦5 μm |
| 10 | 60° C. | $10^6$ Pa | 0 | one side | ≦5 μm |
| 11 | 60° C. | $10^6$ Pa | $10^3$ Pa | one side | ≦5 μm |
| 12 | 60° C. | $10^6$ Pa | $10^6$ Pa | one side | ≦5 μm |
| 13 | 60° C. | $10^6$ Pa | $10^6$ Pa | one side | ≦5 μm |
| 14 | 100° C. | $10^6$ Pa | $10^6$ Pa | one side | ≦5 μm |

(✕1) A low-temperature firable ceramic comprising glass of CaO—$SiO_2$—$Al_2O_3$—$B_2O_3$ system and $Al_2O_3$

TABLE 2

Embodiments

| Sample No. | Previously fired substrate Material | Thickness after firing | Unfired ceramic greensheet Material | Thickness before firing | Restricting greensheet Material |
|---|---|---|---|---|---|
| 15 | (✕1) | 0.4 mm | (✕1) | 0.5 mm | Alumina |
| 16 | ↑ | 0.4 mm | ↑ | 0.5 mm | Alumina |
| 17 | ↑ | 0.4 mm | ↑ | 0.2 mm | Alumina |
| 18 | ↑ | 0.4 mm | ↑ | 0.5 mm | Alumina |
| 19 | ↑ | 0.4 mm | ↑ | 0.7 mm | Alumina |
| 20 | Alumina | 0.3 mm | ↑ | 0.5 mm | Alumina |
| 21 | Ferrite system | 0.3 mm | ↑ | 0.5 mm | Alumina |
| 22 | Relaxor system | 0.3 mm | ↑ | 0.5 mm | Alumina |
| 23 | (✕2) | 0.3 mm | (✕3) | 0.5 mm | Alumina |
| 24 | Barium titanate system | 0.3 mm | (✕1) | 0.5 mm | Alumina |
| 25 | Relaxor system | 0.3 mm | ↑ | 0.5 mm | Alumina |
| 26 | Relaxor system | 0.3 mm | ↑ | 0.5 mm | Alumina |
| 27 | (✕1) | 0.4 mm | (✕3) | 0.5 mm | Zirconia |
| 28 | (✕3) | 0.4 mm | ↑ | 0.5 mm | Zirconia |

| Sample No. | Conditions for thermo compression bonding Temperature | Pressure | Pressure applied during firing | Cavity Structure | Amount of warp in bottom |
|---|---|---|---|---|---|
| 15 | 60° C. | $10^6$ Pa | $10^6$ Pa | one side | ≦5 μm |
| 16 | 60° C. | $10^7$ Pa | $10^6$ Pa | one side | ≦5 μm |
| 17 | 60° C. | $10^6$ Pa | $10^5$ Pa | Both sides | ≦5 μm |
| 18 | 60° C. | $10^6$ Pa | $10^6$ Pa | Both sides | ≦5 μm |
| 19 | 60° C. | $10^6$ Pa | $10^7$ Pa | Both sides | ≦5 μm |
| 20 | 60° C. | $10^6$ Pa | $10^5$ Pa | None | — |
| 21 | 60° C. | $10^6$ Pa | $10^6$ Pa | None | — |
| 22 | 60° C. | $10^6$ Pa | $10^7$ Pa | None | — |
| 23 | 60° C. | $10^{-6}$ Pa | $10^5$ Pa | None | — |
| 24 | 60° C. | $10^6$ Pa | $10^6$ Pa | None | — |
| 25 | 60° C. | $10^6$ Pa | $10^7$ Pa | one side | ≦5 μm |
| 26 | 60° C. | $10^6$ Pa | $10^5$ Pa | Both sides | ≦5 μm |
| 27 | 60° C. | $10^6$ Pa | $10^6$ Pa | one side | ≦5 μm |
| 28 | 60° C. | $10^6$ Pa | $10^6$ Pa | one side | ≦5 μm |

(✕1) A low-temperature firable ceramic comprising glass of CaO—$SiO_2$—$Al_2O_3$—$B_2O_3$ system and $Al_2O_3$
(✕2) A previously fired substrate made from the ceramic designated by symbol ✕1 on which a thick film resistor of ruthenium oxide ($RuO_2$) system is formed, the thick film resisitor being trimmed for adjustment of a resistance value
(✕3) A low-temperature firable ceramic comprising glass of PbO—$SiO_2$—$B_2O_3$ system and $Al_2O_3$ In TABLES 1 and 2, symbol ✕1 in the columns of materials of previously fired substrate and unfired ceramic greensheet designates a low-temperature firable ceramic comprising a blend of 60 weight % glass of CaO—$SiO_2$—$Al_2O_3$—$B_2O_3$ system and 40 weight % alumina. Further, symbol ✕2 designates a previously fired substrate made from the ceramic designated by symbol ✕1 on which a thick film resistor of ruthenium oxide ($RuO_2$) system is formed, the thick film resistor being trimmed for adjustment of a resistance value. Symbol ✕3 designates a low-temperature firable ceramic comprising a blend of glass of PbO—$SiO_2$—$B_2O_3$ system and alumina. "One side" in "structure" in the column of "cavity" designates the multilayer ceramic substrate having one side formed with a cavity as shown in FIG. 1C. "Both sides" designates the multilayer ceramic substrate having both sides formed with respective cavities as shown in FIG. 4.

A visual inspection was carried out for all the multilayer ceramic substrates fired under restriction designated by sample Nos. 1 to 28 in TABLES 1 and 2. As a result, no peeling occurred between the previously fired substrate and a fired layer of the unfired ceramic greensheet, whereupon a degree of sintering was good.

Each of sample Nos. 1 to 16 designates a multilayer ceramic substrate having one side formed with a cavity fabricated in the method of the first embodiment. The obtained multilayer ceramic substrate having one side formed with a cavity had a good dimensional accuracy in each of these samples since an amount of warp in the cavity bottom is equal to or smaller than 5 μm.

Sample No. 10 is a multilayer ceramic substrate fired with no pressure applied under restriction and having one side with a cavity. In this case, too, the restricting greensheet was bonded to the low-temperature firable ceramic greensheet by thermo compression bonding in the step of stacking the restricting greensheet, whereby the obtained multilayer ceramic substrate had substantially the same quality as that obtained by the firing under pressure.

Each of sample Nos. 17 to 19 designates a multilayer ceramic substrate having both sides formed with respective cavities fabricated in the method of the second embodiment.

The obtained multilayer ceramic substrate having both sides formed with respective cavities also had a good dimensional accuracy in each of these samples since an amount of warp in the cavity bottom is equal to or smaller than 5 μm.

In each of sample Nos. 1 to 19, both previously fired substrate and unfired ceramic greensheet were made from the low-temperature firable ceramic designated by symbol ※1. On the other hand, in each of sample Nos. 20 to 26, the previously fired substrate was made from a ceramic material differing from the low-temperature firable ceramic designated by symbol ※1. Thus, the previously fired substrate was made from a ceramic material differing from the material of the unfired ceramic greensheet. For example, in sample No. 20, the previously fired substrate was made from alumina as an insulating ceramic. In sample No. 21, the previously fired substrate was made from a magnetic ceramic of ferrite system. In each of sample Nos. 22, 25 and 26, the previously fired substrate was made from a dielectric ceramic of relaxor system. Further, in sample No. 23, a thick film resistor of ruthenium oxide ($RuO_2$) system was formed on the surface of the previously fired substrate made from the ceramic of ※1, and the thick film resistor was trimmed. The unfired ceramic greensheet was made from a low-temperature firable ceramic comprising a blend of glass of $PbO$—$SiO_2$—$B_2O_3$ system and alumina. In sample No. 24, the previously fired substrate was made from a dielectric ceramic of barium titanate. In sample No. 27, the previously fired substrate was made from a low-temperature firable ceramic of ※1, and the unfired ceramic greensheet was made from a low-temperature firable ceramic of ※3. Further, in sample No. 28, both previously fired substrate and unfired ceramic greensheet were made from the low-temperature firable ceramic of ※3.

In each of sample Nos. 20 to 27, the material of the previously fired substrate differed from that of the unfired ceramic greensheet.

A visual inspection was also carried out for all the multilayer ceramic substrates of sample Nos. 20 to 27. As a result, no peeling occurred between the previously fired substrate and a fired layer of the unfired ceramic greensheet, whereupon a degree of sintering was good. Further, the obtained multilayer ceramic substrate having one or both sides formed with respective cavities also had a good dimensional accuracy in each of these samples since an amount of warp in the cavity bottom is equal to or smaller than 5 μm.

Regarding sample No. 28, both previously fired substrate and unfired ceramic greensheet were made of the low-temperature firable ceramic of ※3. In this sample, too, the obtained multilayer ceramic substrate having one side formed with a cavity had a good dimensional accuracy since an amount of warp in the cavity bottom is equal to or smaller than 5 μm.

On the other hand, TABLE 3 shows experimental results in the case where a multilayer ceramic substrate having one side formed with a cavity was fired in a conventional method in which no restricting greensheet was used.

TABLE 3

| | Comparative Cases | | | |
|---|---|---|---|---|
| | Previously fired substrate | | Unfired ceramic greensheet | |
| Sample No. | Material | Thickness after firing | Material | Thickness before firing |
| 29 | (※1) | 0.4 mm | (※1) | 0.5 mm |
| 30 | ↑ | 0.4 mm | ↑ | 0.5 mm |

TABLE 3-continued

| | Comparative Cases | | | |
|---|---|---|---|---|
| Sample No. | Restricting greensheet Material | Conditions for thermo compression bonding Temperature | Pressure | Pressure applied during firing |
| 29 | None | 100° C. | $10^6$ Pa | 0 |
| 30 | None | 120° C. | $10^7$ Pa | 0 |

| | Cavity | | |
|---|---|---|---|
| Sample No. | Structure | Amount of warp in bottom | Degree of sintering |
| 29 | one side | — | Peeling occurred |
| 30 | one side | — | Peeling occurred |

(※1) A low-temperature firable ceramic comprising glass of CaO—$SiO_2$—$Al_2O_3$—$B_2O_3$ system and $Al_2O_3$ Regarding sample Nos. 29 and 30, the previously fired substrate and the unfired ceramic greensheet were bonded together by thermo-compression bonding. The stack was fired in the conventional method in which no restricting greensheet was used. As the result of the visual inspection, peeling occurred between the previously fired substrate and a fired layer of the unfired ceramic greensheet, whereupon a degree of sintering was low. From the experimental results, it was confirmed that there is a high possibility that the conventional firing method using no restricting greensheet results in a low degree of sintering.

The foregoing description and drawings are merely illustrative of the principles of the present invention and are not to be construed in a limiting sense. Various changes and modifications will become apparent to those of ordinary skill in the art. All such changes and modifications are seen to fall within the scope of the invention as defined by the appended claims.

What is claimed is:

1. A method of fabricating a multilayer ceramic substrate comprising:
   stacking one or a plurality of unfired ceramic greensheets on one or both sides of a previously fired ceramic substrate, thereby forming a stack, each unfired ceramic greensheet having a firing temperature substantially equal to or lower than a firing temperature of the previously fired ceramic substrate;
   stacking a restricting greensheet on the unfired ceramic greensheet composing an outermost layer of the stack, the restricting greensheet having a higher firing temperature than each unfired ceramic greensheet;
   firing the stack at the firing temperature of the unfired ceramic green sheets with or without pressure applied via the restricting greensheet while the stack is under restriction by the restricting greensheet, thereby integrating the stack; and
   eliminating remainders of the restricting greensheet after the firing step, wherein the previously fired substrate and the unfired ceramic greensheets are made from different ceramic materials from each other.

2. The method according to claim 1, wherein the previously fired substrate and the unfired ceramic greensheets are temporarily tacked together in the step where the unfired ceramic greensheets are stacked on the previously fired substrate.

3. The method according to claim 1, wherein the restricting greensheet and the unfired ceramic greensheets are temporarily tacked together in the step where the restrictina greensheet is stacked on the unfired ceramic greensheets.

4. The method according to claim 1, wherein the previously fired substrate and the unfired ceramic greensheets are made from different ceramic materials from each other, and the firing temperature of each unfired ceramic greensheet is equal to or lower than the firing temperature of the previously fired substrate.

5. The method according to claim 1, wherein each unfired ceramic greensheet made from a low-temperature firable ceramic material which is fired at a temperature equal to or lower than 1000° C.

6. The method according to claim 1, wherein the previously fired substrate and/or each unfired ceramic greensheet are made from a ceramic having any one of insulation characteristic, dielectric characteristic, magnetism, piezoelectric, and resistivity.

7. A method of fabricating a multilayer ceramic substrate having a cavity using the method of fabricating a multilayer ceramic substrate according to claim 1, wherein the previously fired substrate is placed on a bottom of a portion where the cavity is to be formed, and an opening for forming the cavity is formed in the unfired ceramic greensheet which is stacked on the previously fired substrate, before or after stacking.

8. The method according to claim 1, wherein a conductor pattern co-firable with the unfired ceramic greensheet is printed on said unfired ceramic greensheet and thereafter, said unfired ceramic greensheet is stacked on one or both sides of the previously fired ceramic substrate.

9. The method according to claim 1, wherein the multilayer ceramic substrate has a surface and a back each one of which is dissimilar to the other.

10. The method according to claim 1, wherein a thick film resistor is formed on the previously fired substrate and the thick film resistor is trimmed for adjustment of a resistance value, and thereafter the unfired ceramic greensheet is stacked on the previously fired substrate.

11. A method of fabricating a multilayer ceramic substrate having a stepped cavity comprising:

stacking one or a plurality of unfired ceramic greensheets on one or both sides of a previously fired ceramic substrate, thereby forming a stack, each unfired ceramic greensheet having a firing temperature substantially equal to or lower than a firing temperature of the previously fired ceramic substrate;

stacking a restricting greensheet on the unfired ceramic greensheet composing an outermost layer of the stack, the restricting greensheet having a higher firing temperature than each unfired ceramic greensheet;

firing the stack at the firing temperature of the unfired ceramic green sheets with or without pressure applied via the restricting greensheet while the stack is under restriction by the restricting greensheet, thereby integrating the stack; and eliminating remainders of the restricting greensheet after the firing step, wherein the previously fired substrate is placed on a bottom of a portion where the cavity is to be formed, and an opening for forming the cavity is formed in the unfired ceramic greensheet which is stacked on the previously fired substrate, before or after stacking, and wherein every time a predetermined number of the unfired ceramic greensheets corresponding to a number of layers of one step of the stepped cavity is stacked on the previously fired substrate, the restricting greensheet are stacked on the unfired ceramic greensheet into the stack, and the stack is fired while being under restriction by the restricting greensheet, thereby fabricating a new fired substrate with one step of cavity, and thereafter, another predetermined number of the unfired ceramic greensheets corresponding to a number of layers of a subsequent step of the stepped cavity and the restricting greensheet are stacked on said new fired substrate into a stack, and the stack is fired while being under restriction by the restricting greensheet, after remainders of the restricting greensheet for fabrication of said new fired substrate has been eliminated, repeatedly so that the multilayer ceramic substrate having the stepped cavity is fabricated.

* * * * *